(12) United States Patent
Hojabri et al.

(10) Patent No.: US 6,670,851 B1
(45) Date of Patent: Dec. 30, 2003

(54) CASCODE AMPLIFIER INTEGRATED CIRCUIT WITH FREQUENCY COMPENSATION CAPABILITY

(75) Inventors: Peyman Hojabri, San Jose, CA (US); Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/615,293

(22) Filed: Jul. 13, 2000

(51) Int. Cl.[7] .................................................. H03F 1/22
(52) U.S. Cl. ......................... 330/311; 330/267; 330/292
(58) Field of Search .................................. 330/267, 292, 330/311

(56) References Cited

U.S. PATENT DOCUMENTS 5,969,564 A * 10/1999 Komatsu et al. ............. 327/534
5,977,610 A    11/1999 Chiu .......................... 257/538

FOREIGN PATENT DOCUMENTS

JP          61156867      *   7/1986

OTHER PUBLICATIONS

Coolbaugh et al. "Advanced Passive Devices for Enhanced Integrated RF Circuit Performance" Radio Frequency Integrated Circuits (RFIC) Symposium 2002 IEEE, pp 341–344.*
Holt "Electronic Circuits Digital and Analog" John Wiley & Sons Copyright 1978 pp 116–119.*
Millman "Microelectronics Digotal and Analog Circuits and Systems" McGraw–Hill 1979 pp. 113, 106.*

P.R. Gray and R.G. Meyer, *Analysis and Design of Analog Integrated Circuits*, Third Edition, 225–226, 464–466 and 511–513 (John Wiley & Sons, 1993).
U.S. patent application No. 09/615,527, filed Jul. 13, 2000.

* cited by examiner

Primary Examiner—Michael B Shingleton
(74) Attorney, Agent, or Firm—Girard & Equitz LLP

(57) ABSTRACT

A cascode amplifier integrated circuit (IC) with frequency compensation capability that possesses a tight overall variation in transient rise and fall time, is relatively small in size and has a relatively high RC series circuit breakdown voltage. The cascode amplifier IC includes an input bias terminal configured to receive a bias voltage $V_b$, a power supply input terminal configured to receive a power supply voltage $V_{cc}$, an input signal terminal configured to receive an input voltage signal $V_{in}$, and an output signal terminal. The cascode amplifier IC also includes a gain stage circuit, an output buffer stage circuit and a resistance-capacitance (RC) series circuit configured to provide frequency compensation during operation of the cascode amplifier IC. The RC series circuit has a peaking bipolar transistor configured to provide a bipolar junction peaking capacitance between the output signal terminal and the gain stage circuit. The bipolar junction peaking capacitance can be provided, for example, as a reverse biased base-collector junction capacitance ($C_{bc}$) of an NPN peaking bipolar transistor. The cascode amplifier IC is smaller in size than conventional cascode amplifier ICs, since the size of the peaking bipolar transistor is smaller than conventional metal-polysilicon peaking capacitors. Furthermore, the collector-base breakdown voltage $BV_{cb}$ of the peaking bipolar transistor is higher than the breakdown voltage of conventional metal-polysilicon peaking capacitors.

13 Claims, 8 Drawing Sheets

FIG. 7

| FIG. 7A | FIG. 7B |

US 6,670,851 B1

CASCODE AMPLIFIER INTEGRATED CIRCUIT WITH FREQUENCY COMPENSATION CAPABILITY

BACKGROUND OF THE INVENTION

1. Field of the Invention

The present invention relates to integrated circuits and, in particular, to amplifier integrated circuits with frequency compensation capability.

2. Description of the Related Art

Amplifier integrated circuits (ICs) constitute one of the basic types of analog integrated circuits. Amplifier ICs are essentially configured to receive an input voltage signal ($V_{in}$), or input current signal, and, in response, provide a larger output voltage signal ($V_{out}$), or larger output current signal. Such amplifier ICs can be used, for example, as an audio power amplifier or to drive a cathode ray tube (CRT).

FIG. 1 is a simplified electrical schematic diagram of a conventional cascode amplifier IC 10. Conventional cascode amplifier IC 10 includes an input bias terminal 12, a power supply input terminal 14, an input signal terminal 16 and an output signal terminal 18. In conventional cascode amplifier IC 10, bipolar transistor X5 (configured as a PNP emitter-follower) functions as an input buffer stage circuit. Such an input buffer stage circuit minimizes the current loading of any pre-amplifier devices (e.g., a video pre-amplifier, not shown). Resistor R9 is configured to turn on bipolar transistor X5 when there is no input voltage signal ($V_{in}$). Resistor R6 functions as a pull-up resistor for bipolar transistor X5 and also limits the current flow therethrough.

Bipolar transistors X1 and X2 are arranged in a cascode configuration to provide a gain stage circuit. For example, bipolar transistor X1 can be a low voltage and very fast bipolar transistor, while bipolar transistor X2 can be a higher voltage bipolar transistor than X1. The cascode configuration of bipolar transistors X1, X2, in this situation, provides the equivalent of a very fast and high voltage bipolar transistor. Resistors R2, R3 set the current flow through bipolar transistors X1, X2, while the resistance ratio of resistors R2 and R3 sets the gain (i.e., amplification) of conventional high frequency cascode amplifier IC 10. Resistor $R_b$ limits the current through bipolar transistor X2. Bipolar transistors X3, X4 are configured to function as an output buffer stage circuit. Bipolar transistor X6, along with resistors R7, R8, are configured as a bias stage circuit and set the bias current through bipolar transistors X3, X4 when there is no change in the level of the input voltage signal $V_{in}$.

For a conventional cascode amplifier IC to successfully operate in the high frequency (i.e., high speed) regime, it should possess a frequency compensation capability that improves the high frequency response of the conventional cascode amplifier IC.

FIG. 2 is a schematic simulation diagram of conventional high frequency cascode amplifier IC 20 with frequency compensation capability. The conventional high frequency cascode amplifier IC 20 is configured to assert an amplified output voltage signal $V_{out}$ (at output signal terminal 22) in response to input voltage signal $V_{in}$ (received at input signal terminal 24), when biased by bias voltage $V_b$ (received at input bias terminal 26) and provided with power supply voltage $V_{cc}$ (received at power supply input terminal 28).

Conventional high frequency cascode amplifier IC 20 includes an input buffer stage circuit 30 that includes bipolar transistor X87, a gain stage circuit 32 that includes bipolar transistors X91, X85, an output buffer stage circuit 34 that includes bipolar transistors X81, X82, X83 and X89, and a bias stage circuit 36 that includes bipolar transistor X84. Conventional high frequency cascode amplifier IC 20 also includes a resistance-capacitance (RC) series circuit 40. RC series circuit 40 is configured to provide for frequency compensation (also referred to as frequency "peaking") during operation of the conventional high frequency cascode amplifier IC 20. The RC series circuit 40 includes resistors R112, R102 that are electrically connected in series with two metal-polysilicon peaking capacitors C63, C102. As depicted in FIG. 2, RC series circuit 40 provides for frequency compensation by feeding the amplified output signal ($V_{out}$) back to an emitter of bipolar transistor X91 of the gain stage circuit 32 of the conventional high frequency cascode amplifier IC 20 through the RC series circuit 40.

One skilled in the art will recognize that FIGS. 1 and 2 are representative of a variety of well known conventional cascode amplifier IC configurations. Further descriptions of cascode amplifier ICs are included in U.S. Pat. No. 5,977,610 to Hon Kin Chiu, "Analysis and Design of Analog Integrated Circuits, Third Edition" by P. R. Gray and R. G. Meyer, pp. 225–226, 464–466 and 511–513 (John Wiley & Sons, 1993), and co-pending application Ser. No. 09/615,527, Hon Kin Chiu, "Cascode Amplifier Integrated Circuit With Reduced Miller Capacitance at an Output Buffer Stage During a Transient Fall Response"), each of which is hereby fully incorporated by reference.

A drawback of conventional cascode amplifier ICs with frequency compensation capability is a wide variation in transient rise and fall times. Such a wide variation is due to inherent tolerances in the speed of the bipolar transistors in the circuits, as well as in the capacitance of the metal-polysilicon peaking capacitors. These inherent tolerances are caused by variations in the manufacturing process. Consequently, a given conventional cascode amplifier IC may include either "fast" or "slow" bipolar transistors and metal-polysilicon peaking capacitors with either a minimum or a maximum capacitance.

There is, moreover, no relationship or tracking between the speed of the bipolar transistors and the capacitance of the metal-polysilicon peaking capacitors. If, for example, the bipolar transistors are "fast" and the metal-polysilicon peaking capacitors are at their typical value, the conventional cascode amplifier IC will tend to exhibit a transient overshoot. If, however, the bipolar transistors are "slow" and the metal-polysilicon peaking capacitors are at their minimum capacitance, the conventional cascode amplifier IC will exhibit long transient rise and fall times. The overall transient rise and fall time variation for conventional cascode amplifier ICs is, therefore, undesirably large.

FIGS. 3–6 depict the transient rise and fall responses for the conventional high frequency cascode amplifier IC of FIG. 2. FIG. 3 depicts the transient rise response for the circumstances of "fast" transistors (curve 3A) and "slow" transistors (curve 3B) and metal-polysilicon peaking capacitors with typical capacitance values. For the fast transistors, the transient rise time is approximately 3.40 nano-seconds, while for the slow transistors it is approximately 3.86 nano-seconds.

FIG. 4 depicts the transient fall response for the circumstances of "fast" transistors (curve 4A) and "slow" transistors (curve 4B) and metal-polysilicon peaking capacitors with typical capacitance values. For the fast transistors, the transient fall time is approximately 3.69 nano-seconds, while for the slow transistors it is approximately 4.23 nano-seconds.

FIG. 5 depicts the transient rise response for the circumstances of "fast" transistors with metal-polysilicon peaking capacitors at their maximum value (curve 5A) and "slow" transistors with metal-polysilicon peaking capacitors at their minimum capacitance value (curve 5B). For curve 5A, the transient rise time is approximately 3.29 nano-seconds, while for curve 5B it is approximately 4.03 nano-seconds.

FIG. 6 depicts the transient fall response for the circumstances of "fast" transistors with metal-polysilicon peaking capacitors at their maximum value (curve 6A) and "slow" transistors with metal-polysilicon peaking capacitors at their minimum capacitance value (curve 6B). For curve 6A, the transient fall time is approximately 3.53 nano-seconds, while for curve 6B it is approximately 4.42 nano-seconds.

Based on FIGS. 3–6, the overall variation in transient rise and fall time for the conventional high frequency cascode amplifier IC of FIG. 2 is 1.13 nano-seconds (i.e., 4.42 nano-seconds minus 3.29 nano-seconds). This relatively large overall variation in transient rise and fall times is undesirable.

Furthermore, the use of metal-polysilicon peaking capacitors in conventional cascode amplifier ICs with frequency compensation capability results in a relatively low RC series circuit breakdown voltage and an IC with a relatively large size.

Still needed in the field, therefore, is a cascode amplifier IC with frequency compensation capability that provides for a tight overall variation in transient rise and fall times. In addition, the cascode amplifier IC with frequency compensation capability should be relatively small in size and possess relatively high RC series circuit breakdown voltages.

SUMMARY OF THE INVENTION

The present invention provides a cascode amplifier integrated circuit with frequency compensation capability that possesses a tight overall variation in transient rise and fall times. In addition, cascode amplifier integrated circuits with frequency compensation capability according to the present invention are relatively small in size and have relatively high RC series circuit breakdown voltages.

A cascode amplifier integrated circuit (IC) with frequency compensation capability according to the present invention includes an input bias terminal configured to receive a bias voltage $V_b$, (e.g., a 12 volt bias voltage signal), a power supply input terminal configured to receive a power supply voltage $V_{cc}$, (e.g., an 80 volt power supply voltage signal), an input signal terminal configured to receive an input voltage signal $V_{in}$ and an output signal terminal.

The cascode amplifier IC with frequency compensation capability according to the present invention also includes a gain stage circuit and an output buffer stage circuit. The gain stage circuit is configured to amplify the input voltage signal received at the input signal terminal and to thereby produce an amplified voltage signal. The output buffer stage circuit is configured to receive the amplified voltage signal from the gain stage circuit, increase the current thereof and transmit the resultant amplified voltage signal with increased current to the output signal terminal as an amplified output voltage signal.

Furthermore, the cascode amplifier IC with frequency compensation capability according to the present invention also includes a resistance-capacitance (RC) series circuit configured to provide frequency compensation during its operation. This RC series circuit has a peaking bipolar transistor (e.g., an NPN peaking bipolar transistor) configured to provide a bipolar junction peaking capacitance between the output signal terminal and the gain stage circuit. The bipolar junction peaking capacitance can be provided, for example, as the reverse biased base-collector junction capacitance ($C_{bc}$) of an NPN peaking bipolar transistor.

Since the RC series circuit of cascode amplifier ICs with frequency compensation capability according to the present invention employs a single bipolar junction peaking capacitance (instead of a plurality of conventional metal-polysilicon peaking capacitors), any manufacturing induced variation of the RC series circuit capacitance tracks with any manufacturing induced variation in the bipolar transistors of the various circuits (e.g., the gain stage circuit and the output buffer stage circuit). The result is a cascode amplifier IC with frequency compensation capability that possesses a relatively tight variation of transient rise and fall times. In addition, since a bipolar transistor is smaller in size than a combination of any number of conventional metal-polysilicon peaking capacitors, the size of cascode amplifier ICs with frequency compensation capability according to the present invention is relatively small. Furthermore, the collector-base breakdown voltage ($BV_{cb}$) of the peaking bipolar transistor is higher than the breakdown voltage of conventional metal-polysilicon peaking capacitors.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

Figure 1:
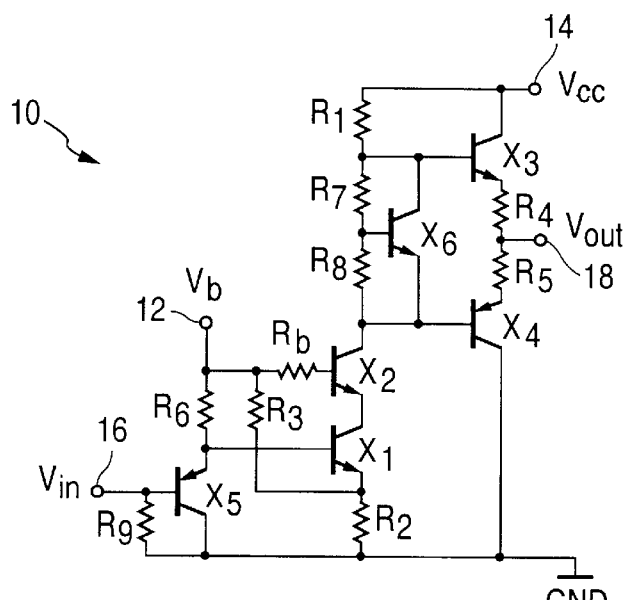
FIG. 1 is a simplified electrical schematic for a conventional cascode amplifier IC.
Figure 3:
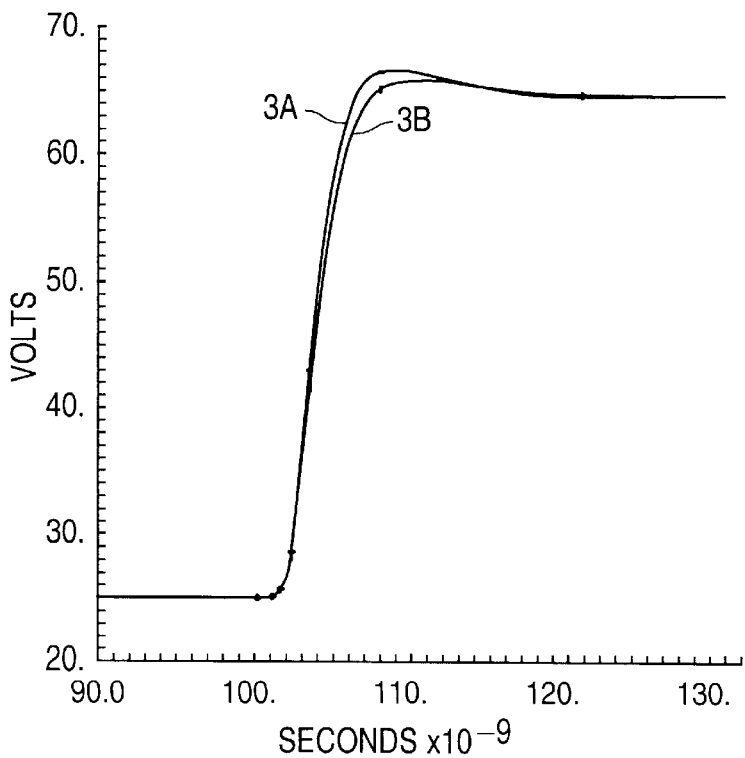
FIG. 3 depicts the transient rise response of the conventional high frequency cascode amplifier IC of FIG. 2 for the circumstances of "fast" transistors and "slow" transistors and metal-polysilicon peaking capacitors with typical capacitance values.
Figure 2A:
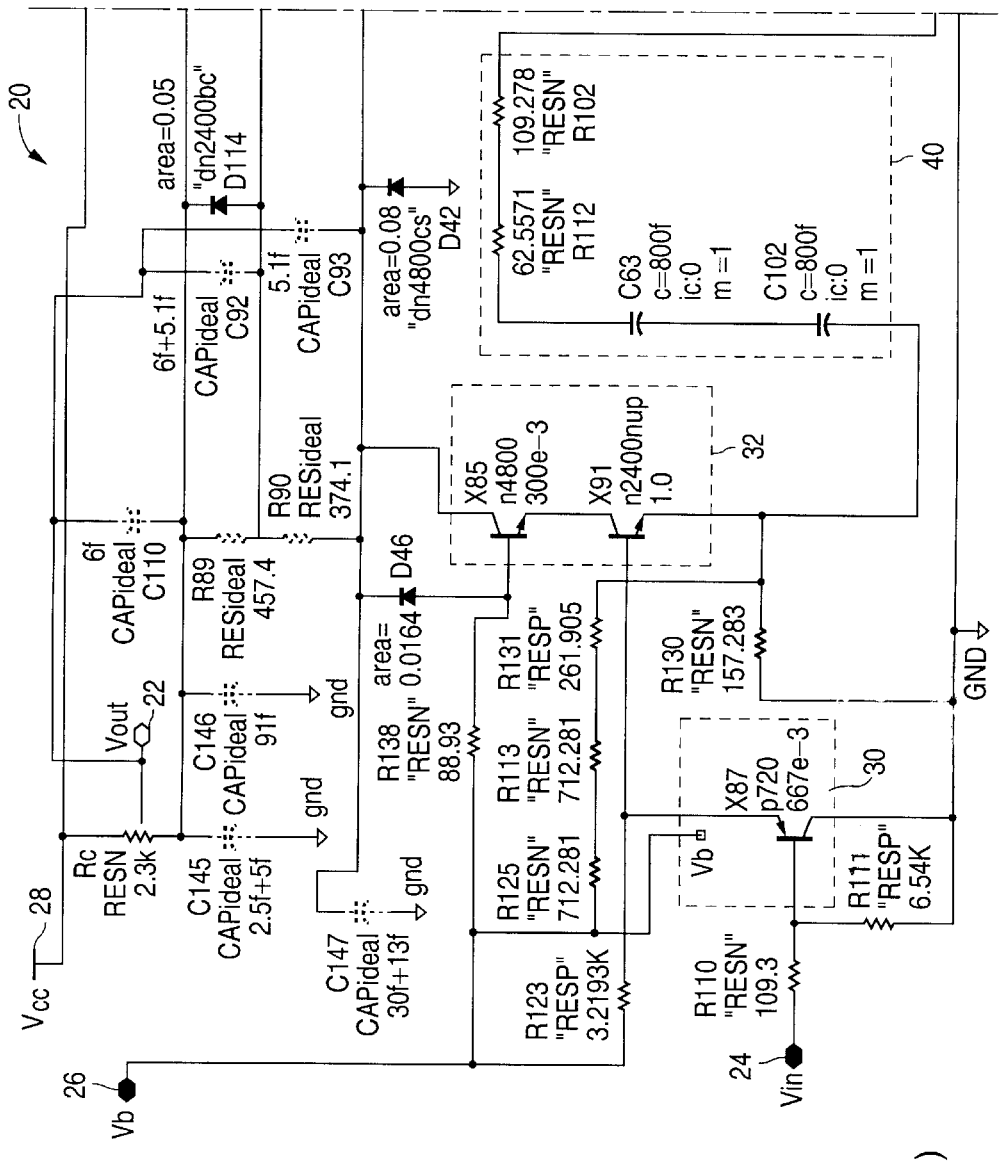
FIG. 2 is an electrical simulation schematic for a conventional high frequency cascode amplifier IC. The dashed rectangles indicate the essential boundaries of various circuits within the conventional high frequency cascode amplifier IC, while the dashed elements represent parasitics.
Figure 2B:
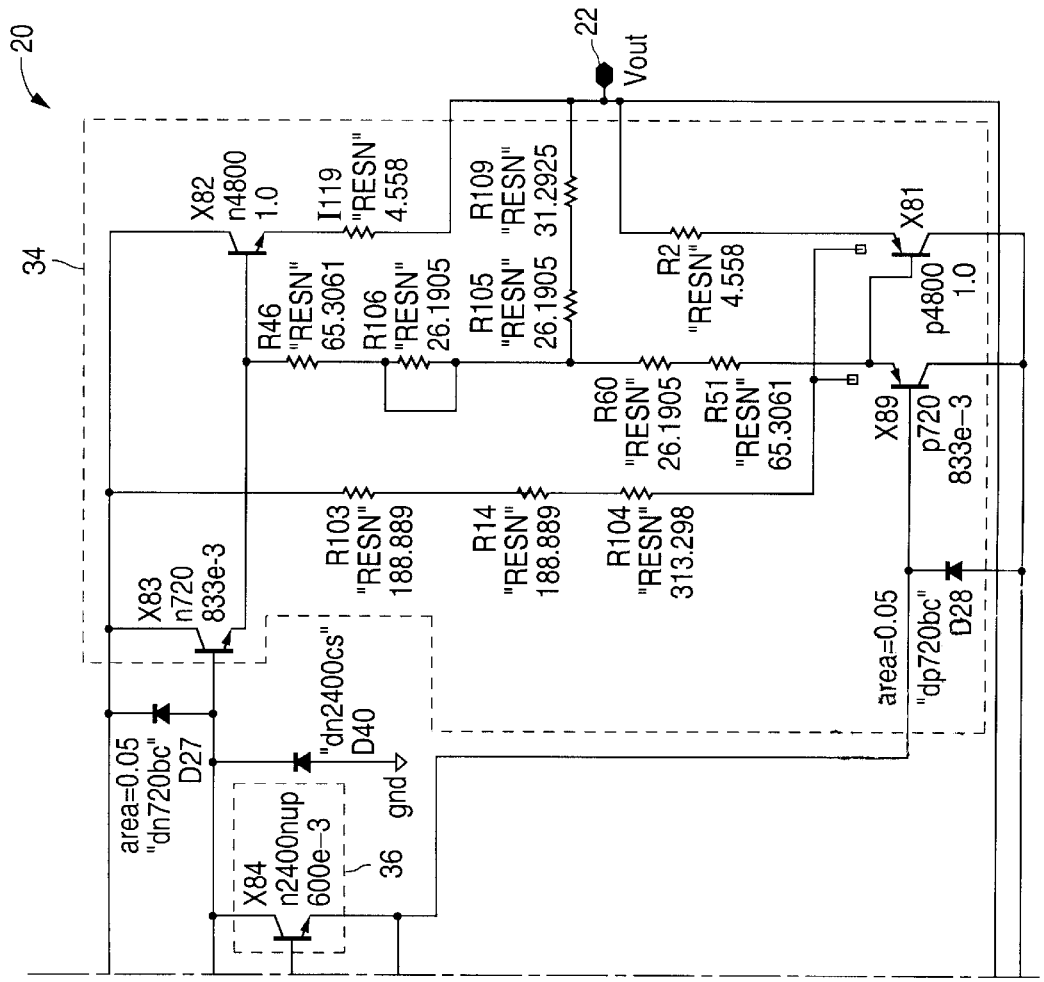
Figure 4:
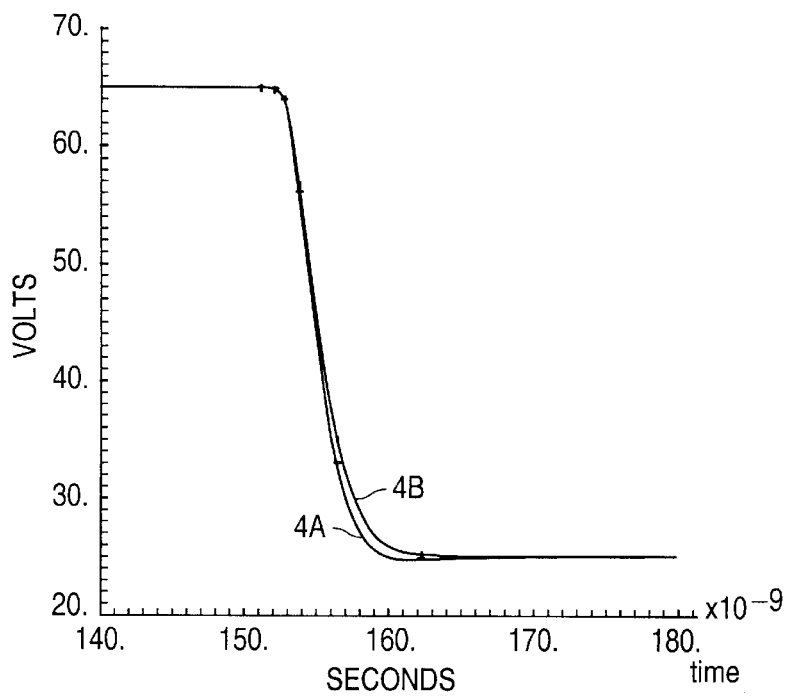
FIG. 4 depicts the transient fall response of the conventional high frequency cascode amplifier IC of FIG. 2 for the circumstances of "fast" transistors and "slow" transistors and metal-polysilicon peaking capacitors with typical capacitance values.
Figure 5:
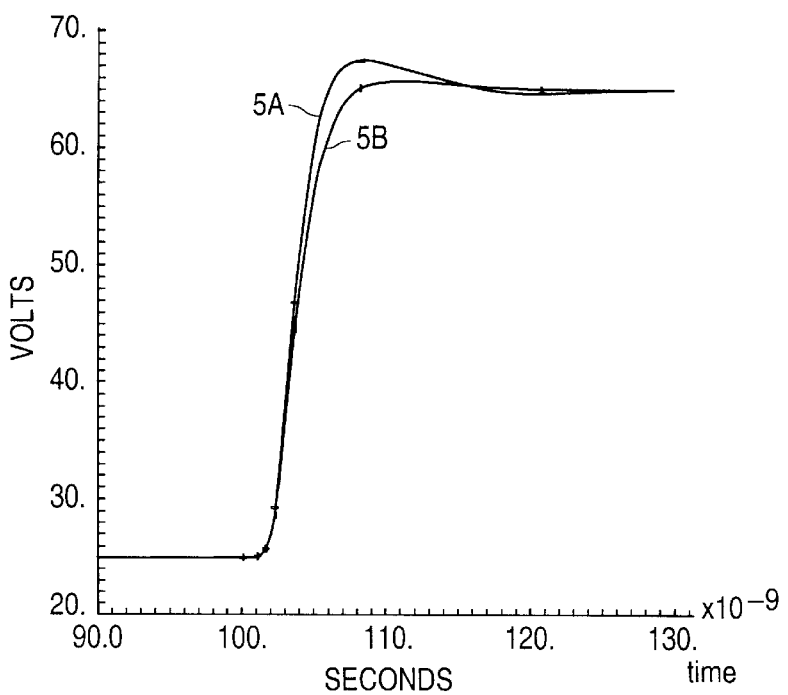
FIG. 5 depicts the transient rise response of the conventional high frequency cascode amplifier IC of FIG. 2 for the circumstances of "fast" transistors with metal-polysilicon peaking capacitors at their maximum value and "slow" transistors with metal-polysilicon peaking capacitors at their minimum capacitance value.
Figure 6:
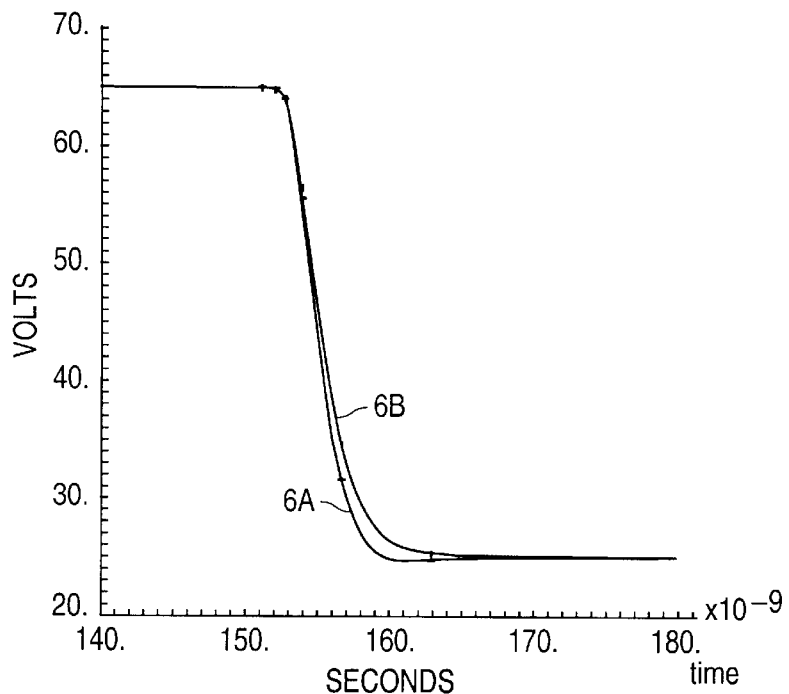
FIG. 6 depicts the transient fall response of the conventional high frequency cascode amplifier IC of FIG. 2 for the circumstances of "fast" transistors with metal-polysilicon peaking capacitors at their maximum value and "slow" transistors with metal-polysilicon peaking capacitors at their minimum capacitance value.
Figure 7A:
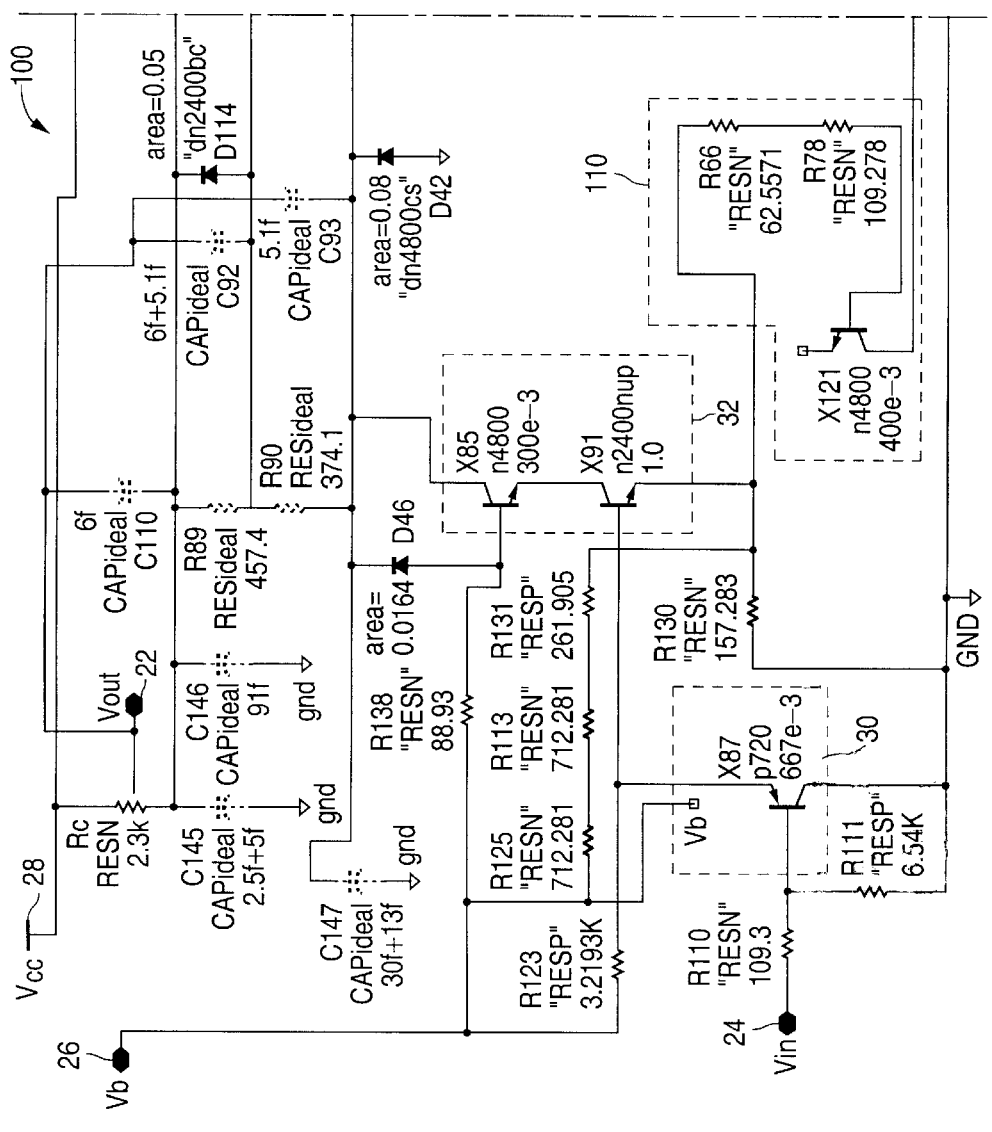
FIG. 7 is an electrical simulation schematic for a cascode amplifier IC with frequency compensation capability according to the present invention. The dashed rectangles indicate the essential boundaries of various circuits within the cascode amplifier IC with frequency compensation capability, while the dashed elements represent parasitics.
Figure 7B:
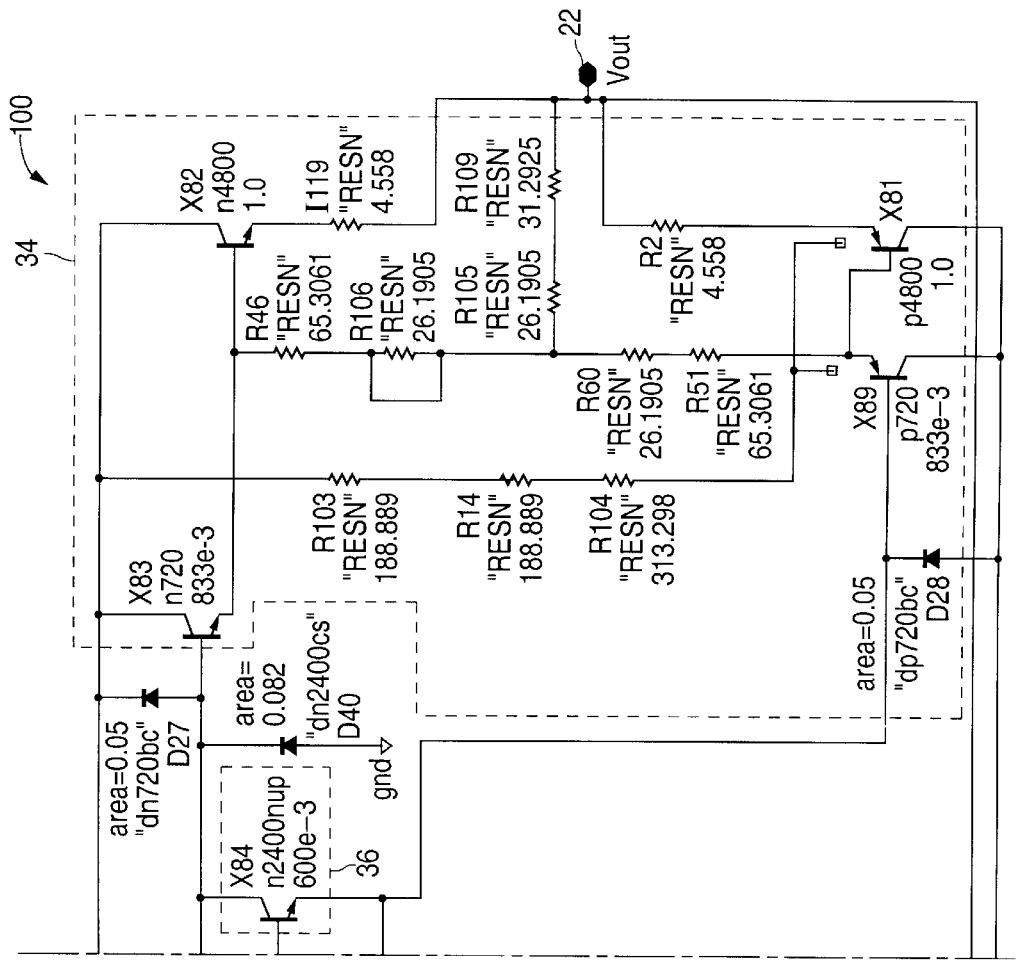

FIG. 7 illustrates a cascode amplifier integrated circuit (IC) 100 with frequency compensation capability according to the present invention. In FIG. 7, like numerals are employed to indicate like elements from FIG. 2 and parasitics are indicated by dashed elements. Cascode amplifier IC 100 is configured to assert an amplified output voltage signal $V_{out}$ (at output signal terminal 22) in response to input voltage signal $V_{in}$ (received at input signal terminal 24), when biased by bias voltage $V_b$ (also referred to as a bias signal, received at input bias terminal 26) and provided with power supply voltage $V_{cc}$ (received at power supply input terminal 28).

Bias voltage $V_b$ can be, for example, a 12 volt bias voltage. The input voltage signal $V_{in}$ can be, for example, an input signal from a video pre-amplifier in the range of from 1.4 volts to 4.2 volts. The power supply voltage $V_{cc}$ can be, for example, an 80 volt power supply voltage.

Cascode amplifier IC 100 includes an input buffer stage circuit 30 that includes bipolar transistor X87, a gain stage circuit 32 that includes bipolar transistors X91 (a gain bipolar transistor) and X85 (a cascode bipolar transistor configured to increase the band width of the gain stage circuit 32), an output buffer stage circuit 34 that includes bipolar transistors X81, X82, X83 and X89, and a bias stage circuit 36 that includes bipolar transistor X84.

Gain stage circuit 32 is configured to provide a gain (i.e., amplification) of −14. In other words, the gain stage circuit 32 is configured to amplify the input voltage signal $V_{in}$ by a factor of 14. For an input voltage signal in the range of 1.4 volts to 4.2 volts, the resulting amplified output voltage signal ($V_{out}$) would be in the range of approximately 20 to 60 volts.

Bias stage circuit 36 is configured to set the quiescent current (i.e., static current) of the output buffer stage circuit 34. In FIG. 7, the output buffer stage circuit 34 is configured as an NPN push-pull output buffer stage circuit. Since the gain stage circuit 32 is configured to only amplify the input voltage signal ($V_{in}$), the current of the amplified output voltage signal ($V_{out}$) may not be enough to drive an electronic device (e.g., a CRT) connected to the output signal terminal 22. The output buffer stage circuit 34 is, therefore, configured to isolate the electronic device from the gain stage circuit 32 and supply additional current to the output voltage signal. The gain of the output buffer stage circuit 34 is, however, 1.

Cascode amplifier IC 100 with frequency compensation capability according to the present invention also includes a resistance-capacitance (RC) series circuit 110. RC series circuit 110 is configured to provide for frequency compensation (also referred to as frequency "peaking") during operation of the cascode amplifier IC 100. The RC series circuit 110 includes resistors R66, R78 that are electrically connected in series with peaking bipolar transistor X121. As shown in FIG. 7, RC series circuit 110 provides for frequency compensation by feeding an output voltage signal back to an emitter of bipolar transistor X91 of the gain stage circuit 32 of the cascode amplifier IC 100 through the RC series circuit 110.

Peaking bipolar transistor X121 is configured to provide a bipolar junction peaking capacitance between the output signal terminal 22 and the gain stage circuit 32. In FIG. 7, the bipolar junction peaking capacitance is provided as a reverse biased base-collector junction capacitance ($C_{bc}$) of the peaking bipolar transistor X121. The bipolar junction peaking capacitance is, for example, in the range of 360 femto-farads (i.e., 360 fF or $360 \times 10^{-15}$ farads) to 440 femto-farads (i.e., 440 fF or $440 \times 10^{-15}$ farads).

One skilled in the art will recognize that cascode amplifier IC 100 with frequency compensation capability according to the present invention is essentially a wide-band, high frequency amplifier suitable for use as, for example, a CRT driver. A benefit of cascode amplifier ICs with frequency compensation capability according to the present invention is that the bipolar junction peaking capacitance of the peaking bipolar transistor tracks the base-collector junction capacitances of bipolar transistors in other circuits of the cascode amplifier IC (e.g., the gain stage circuit, input buffer stage circuit and output buffer stage circuit). For example, if the speed of these bipolar transistors are "slow," the bipolar junction peaking capacitance must be relatively large. These two effects (i.e., slow bipolar transistor and large bipolar junction peaking capacitance) will cancel each other, at least to a first order effect. Therefore, the overall variation in transient rise and fall times of cascode amplifier ICs with frequency compensation capability according to the present invention is relatively tight compared to that of conventional cascode amplifier ICs.

Figure 8:
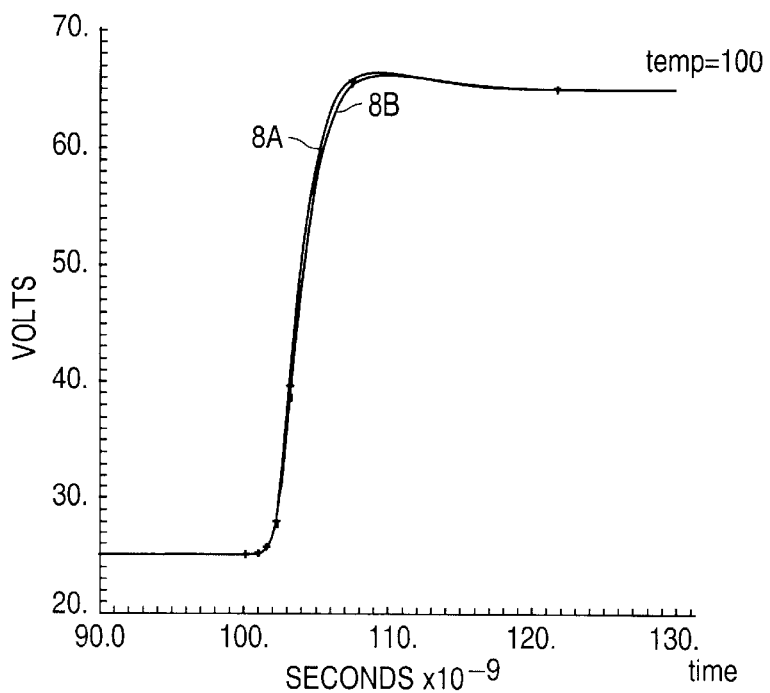
FIG. 8 depicts the transient rise response of the cascode amplifier IC with frequency compensation capability of FIG. 7 for the circumstances of "fast" and "slow" transistors.
Figure 9:
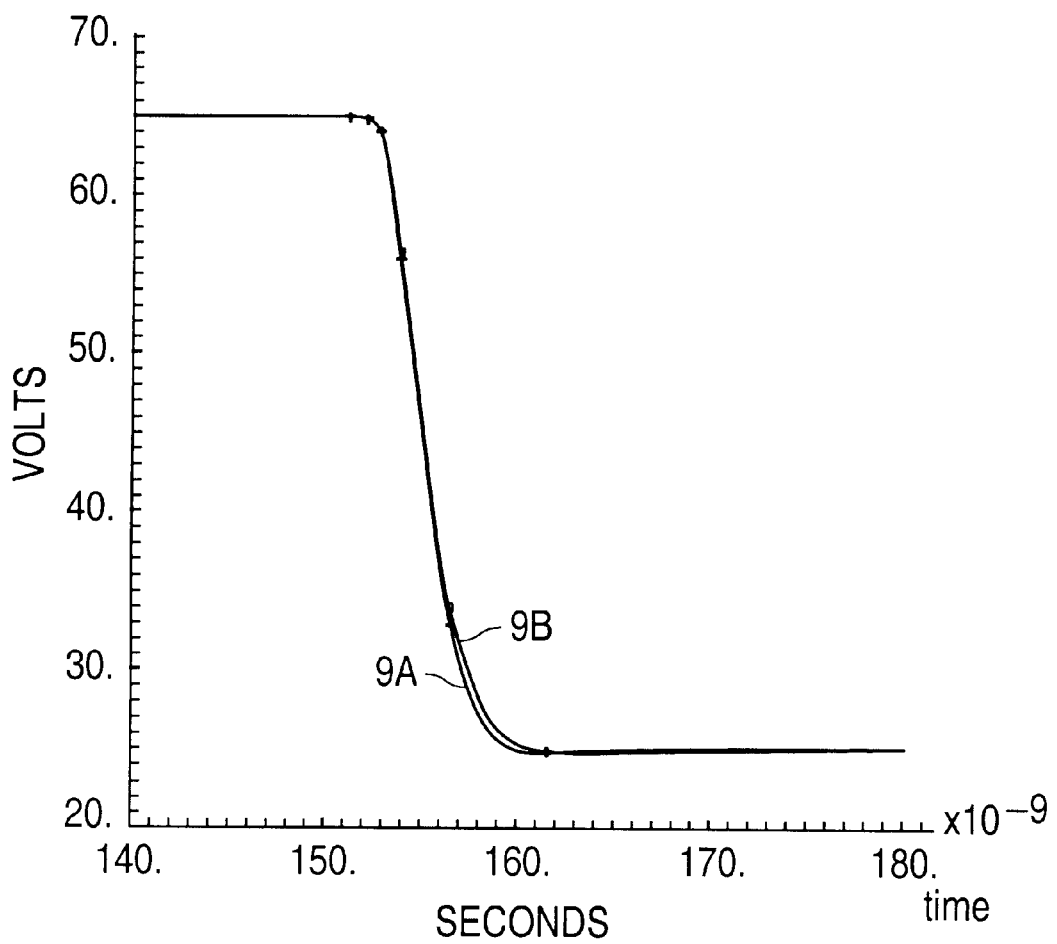
FIG. 9 depicts the transient fall response of the cascode amplifier IC with frequency compensation capability of FIG. 7 for the circumstances of "fast" and "slow" transistors.

FIG. 8 plots the transient rise response of the cascode amplifier IC with frequency compensation capability of FIG. 7 for the circumstances of "fast" bipolar transistors (curve 8A) and "slow" bipolar transistors (curve 8B). FIG. 9 plots the transient fall response of the cascode amplifier IC with frequency compensation capability of FIG. 7 for the circumstances of "fast" bipolar transistors (curve 9A) and "slow" transistors (curve 9B).

For curve 8A, the transient rise time is approximately 3.51 nano-seconds, while for curve 8B it is approximately 3.71 nano-seconds. For curve 9A, the transient fall time is approximately 3.86 nano-seconds, while for curve 9B it is approximately 4.08 nano-seconds. Based on FIGS. 8 and 9, the overall variation in transient rise and fall time for the cascode amplifier IC of FIG. 7 is 0.57 nano-seconds (i.e., 4.08 nano-seconds minus 3.51 nano-seconds). This overall variation in transient rise and fall times is significantly less than the 1.13 nano-seconds of the conventional cascode amplifier IC of FIG. 2.

Furthermore, cascode amplifier ICs with frequency compensation capability according to the present invention are relatively small in size and also possess relatively high RC series circuit breakdown voltages. The relatively small size is due to the replacement of a plurality of metal-polysilicon peaking capacitors with a single peaking bipolar transistor of a smaller area. The relatively high RC series circuit breakdown voltage is due to the replacement of a plurality of metal-polysilicon peaking capacitors (each with a typical RC series circuit breakdown voltage of, for example, 60 volts) with a single peaking bipolar transistor with a collector-base breakdown voltage ($BV_{cb}$) of approximately 95 volts.

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. A cascode amplifier integrated circuit with frequency compensation capability, the cascode amplifier integrated circuit comprising:

an input bias terminal configured to receive a bias voltage;

a power supply input terminal configured to receive a power supply voltage;

an input signal terminal configured to receive an input voltage signal;

an output signal terminal;

a gain stage circuit configured to amplify the input voltage signal received at the input signal terminal to produce an amplified voltage signal;

an output buffer stage circuit configured to receive the amplified voltage signal from the gain stage circuit, to increase the current of the received amplified voltage signal and to transmit the resultant amplified voltage signal with increased current to the output signal terminal as an amplified output voltage signal; and a resistance-capacitance (RC) series circuit configured to provide frequency compensation during operation of the cascade amplifier integrated circuit, the RC series circuit having a peaking bipolar transistor configured to provide a bipolar junction peaking capacitance between the output signal terminal and the gain stage circuit.

2. The cascode amplifier integrated circuit of claim 1 further comprising:

an input buffer stage circuit configured to receive an input voltage signal from the input signal terminal and transmit the received input voltage signal to the gain stage circuit, the input buffer stage circuit also con figured to minimize current loading on an electronic device supplying the input voltage signal; and a bias stage circuit configured to set the quiescent current of the output buffer stage circuit.

3. The cascode amplifier integrated circuit of claim 1, wherein the bipolar junction peaking capacitance is provided as a reverse biased base-collector junction capacitance ($C_{bc}$) of the peaking bipolar transistor.

4. The cascode amplifier integrated circuit of claim 3, wherein the reverse biased base-collector junction capacitance is in the range of 360 fF to 440 fF.

5. The cascode amplifier integrated circuit of claim 3, wherein the peaking bipolar transistor is an NPN peaking bipolar transistor.

6. The cascode amplifier integrated circuit of claim 1, wherein the gain stage circuit includes a plurality of bipolar gain stage transistors in a cascode configuration.

7. The cascode amplifier circuit of claim 6, wherein the plurality of bipolar gain stage transistors includes at least one gain bipolar transistor and at least one cascode bipolar transistor.

8. The cascode amplifier integrated circuit of claim 7, wherein the peaking bipolar transistor is configured to provide a bipolar junction peaking capacitance between the output signal terminal and an emitter of the gain bipolar transistor.

9. The cascode amplifier integrated circuit of claim 1, wherein the output buffer stage circuit is configured as an NPN push-pull output buffer stage circuit.

10. A high frequency cascode amplifier integrated circuit with frequency compensation capability comprising:

an output signal terminal;

a gain stage circuit; and a resistance-capacitance (RC) series circuit configured to provide frequency compensation during operation of the high frequency cascode amplifier integrated circuit, the RC series circuit having a peaking bipolar transistor configured to provide a bipolar junction peaking capacitance between the output signal terminal and the gain stage circuit.

11. The high frequency cascode amplifier integrated circuit of claim 10, wherein the bipolar junction peaking capacitance is provided as a reverse biased base-collectorjunction capacitance ($C_{bc}$) of the peaking bipolar transistor.

12. The high frequency cascode amplifier integrated circuit of claim 10, wherein the gain stage circuit includes a plurality of bipolar gain stage transistors configured in a cascode configuration, which includes at least one gain bipolar transistor and at least one cascode bipolar transistor.

13. The high frequency cascode amplifier integrated circuit of claim 12, wherein the peaking bipolar transistor is configured to provide a bipolar junction peaking capacitance between the output signal terminal and an emitter of the gain bipolar transistor.

* * * * *

UNITED STATES PATENT AND TRADEMARK OFFICE
CERTIFICATE OF CORRECTION

PATENT NO.    : 6,670,851 B1
DATED         : December 30, 2003
INVENTOR(S)   : Peyman Hojabri et al.

It is certified that error appears in the above-identified patent and that said Letters Patent is hereby corrected as shown below:

Column 7,
Line 33, "con figured" should be -- configured --.

Signed and Sealed this

Twenty-fourth Day of February, 2004

JON W. DUDAS
*Acting Director of the United States Patent and Trademark Office*